US009287499B2

(12) United States Patent
Tajima et al.

(10) Patent No.: US 9,287,499 B2
(45) Date of Patent: Mar. 15, 2016

(54) INTEGRATED CIRCUIT DEVICE (71) Applicant: Kabushiki Kaisha Toshiba, Minato-ku (JP)

(72) Inventors: Hikari Tajima, Koganei (JP); Masaki Kondo, Yokkaichi (JP); Tsukasa Nakai, Yokkaichi (JP); Takashi Izumida, Yokohama (JP); Nobuaki Yasutake, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/464,084

(22) Filed: Aug. 20, 2014

(65) Prior Publication Data

US 2015/0349252 A1 Dec. 3, 2015

Related U.S. Application Data (60) Provisional application No. 62/004,614, filed on May 29, 2014.

(51) Int. Cl.
  *H01L 23/62* (2006.01)
  *H01L 45/00* (2006.01)

(52) U.S. Cl.
  CPC .......... *H01L 45/1253* (2013.01); *H01L 45/122* (2013.01)

(58) Field of Classification Search
  CPC ................... H01L 21/76202; H01L 21/02126; H01L 21/28079; H01L 21/02063; H01L 21/02579; H01L 21/0214; H01L 21/3212; H01L 21/02513; H01L 21/02642; H01L 21/8229; H01L 27/3248; H01L 27/11524; H01L 27/5288; H01L 28/60; H01L 29/8615; H01L 51/102; H01L 21/8238
  USPC ......... 257/359, 347, 396, 421, 295, 296, 491, 257/649, 684, 686, 689, 760, E21.006, 257/E21.008, E21.009, E21.011, E21.126, 257/E21.127, E21.128, E21.17, E21.202, 257/E21.208, E21.218, E21.267, E21.293, 257/E21.304, E21.32, E21.411
  See application file for complete search history.

(56) References Cited

U.S. PATENT DOCUMENTS

| 5,698,869 A | 12/1997 | Yoshimi et al. |
| 8,283,229 B2 | 10/2012 | Kim et al. |
| 2008/0179750 A1* | 7/2008 | Arnal et al. .................... 257/758 |
| 2010/0072552 A1 | 3/2010 | Sunami et al. |
| 2010/0323477 A1* | 12/2010 | Arnal et al. .................... 438/121 |

FOREIGN PATENT DOCUMENTS

| JP | 8-213622 A | 8/1996 |
| JP | 2010-73879 A | 4/2010 |

* cited by examiner

*Primary Examiner* — David Nhu
(74) *Attorney, Agent, or Firm* — Oblon, McClelland, Maier & Neustadt, L.L.P.

(57) ABSTRACT

An integrated circuit device according to an embodiment includes an electrode extending in a first direction, two semiconductor members spaced from each other in the first direction and extending in a second direction crossing the first direction, an insulating film placed between each of the two semiconductor members and the electrode and made of a first insulating material, and a first dielectric member placed between the two semiconductor members and made of a second insulating material having a higher permittivity than the first insulating material.

20 Claims, 11 Drawing Sheets

FIG. 13A
(COMPARATIVE EXAMPLE)

FIG. 13B
(PRACTICAL EXAMPLE 1)

FIG. 13C
(PRACTICAL EXAMPLE 2)

INTEGRATED CIRCUIT DEVICE

CROSS-REFERENCE TO RELATED APPLICATIONS

This application is based upon and claims the benefit of priority from U.S. Provisional Patent Application 62/004,614, filed on May 29, 2014; the entire contents of which are incorporated herein by reference.

FIELD

Embodiments described herein relate generally to an integrated circuit device.

BACKGROUND

Recently, there has been proposed a memory device in which memory cells are integrated in two dimensions or three dimensions. In such a memory device, the memory cell for writing or reading data is selected by selecting one of a plurality of wirings provided parallel to each other. The selection of the wiring can be performed by connecting a TFT (Thin Film Transistor) to the wiring and switching on/off this TFT.

BRIEF DESCRIPTION OF THE DRAWINGS

FIGS. 3A to 6B are perspective views illustrating a method for manufacturing the integrated circuit device according to the first embodiment;

FIGS. 13A to 13C show simulation conditions in a test example.

DETAILED DESCRIPTION

An integrated circuit device according to an embodiment includes an electrode extending in a first direction, two semiconductor members spaced from each other in the first direction and extending in a second direction crossing the first direction, an insulating film placed between each of the two semiconductor members and the electrode and made of a first insulating material, and a first dielectric member placed between the two semiconductor members and made of a second insulating material having a higher permittivity than the first insulating material.

Embodiments of the invention will now be described with reference to the drawings.

First Embodiment

First, a first embodiment is described.

Figure 1:
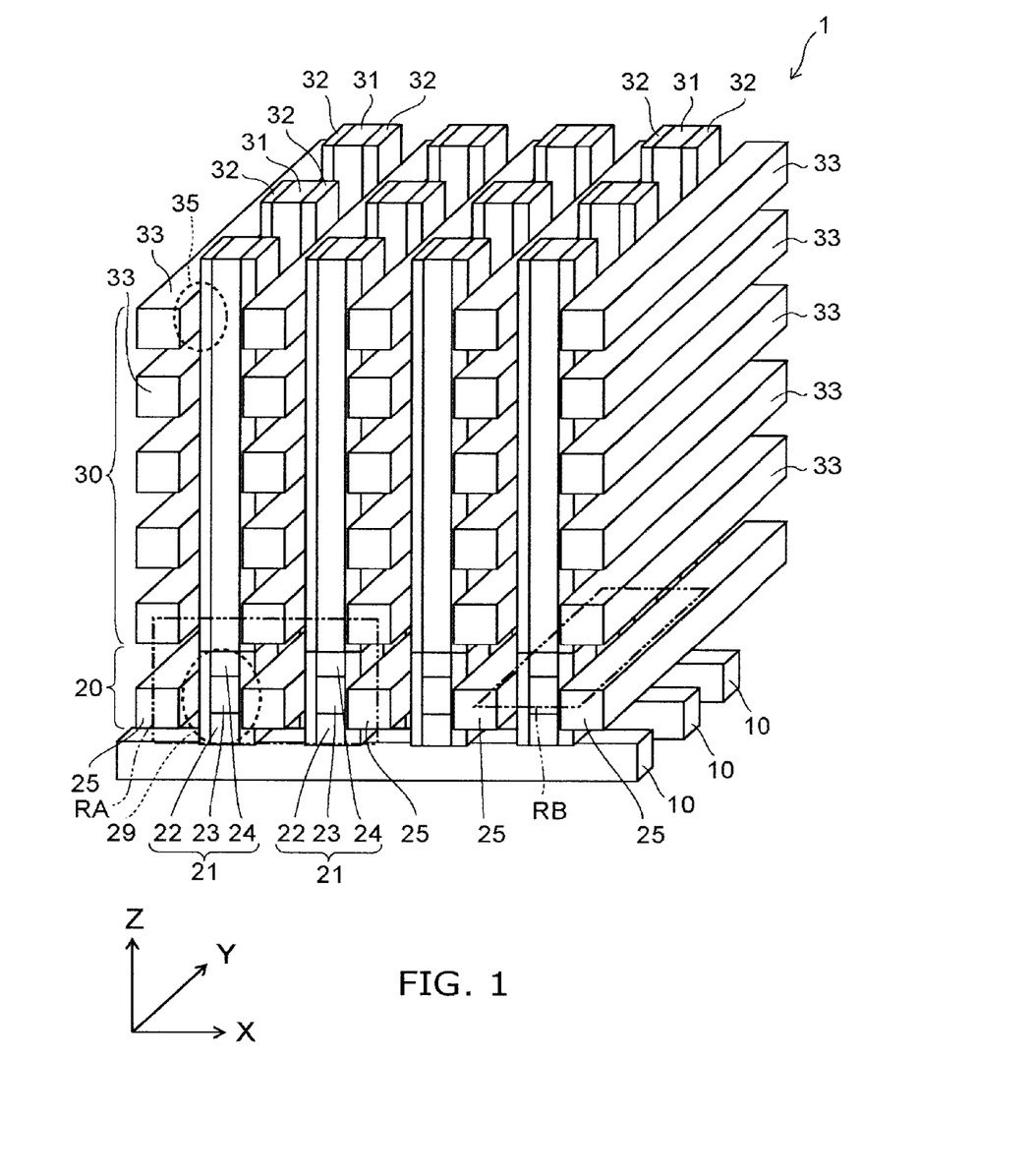
FIG. 1 is a perspective view illustrating an integrated circuit device according to a first embodiment.

FIG. 1 is a perspective view illustrating an integrated circuit device according to the embodiment.

Figure 2A:
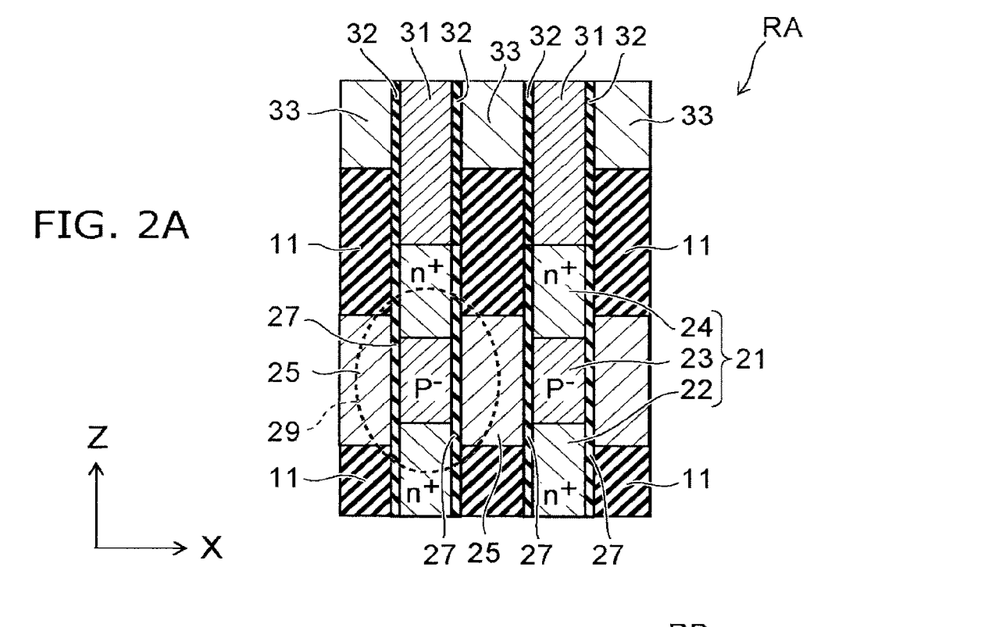
FIG. 2A is a sectional view illustrating a region RA of FIG. 1.
Figure 2B:
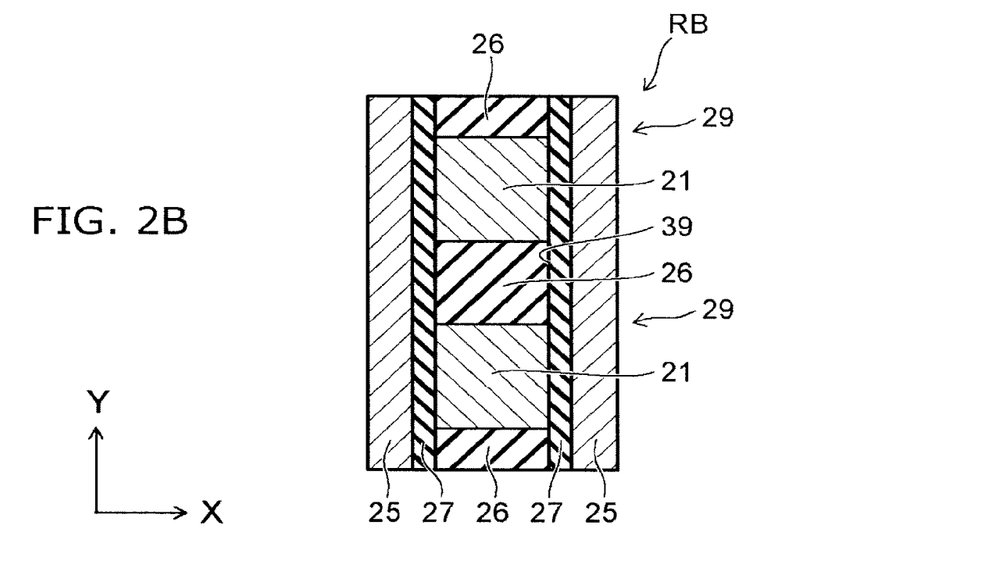
FIG. 2B is a sectional view illustrating a region RB of FIG. 1.

FIG. 2A is a sectional view illustrating the region RA of FIG. 1. FIG. 2B is a sectional view illustrating the region RB of FIG. 1.

For convenience of illustration, FIG. 1 shows only major members.

The integrated circuit device according to the embodiment is a ReRAM (Resistance Random Access Memory).

In the following, for convenience of description, an XYZ orthogonal coordinate system is adopted in this specification.

As shown in FIG. 1, in the integrated circuit device 1 according to the embodiment, an insulating film (not shown) is provided on a silicon substrate (not shown). A plurality of global bit lines 10 extending in the X-direction are provided on the insulating film. The plurality of global bit lines 10 are arranged periodically along the Y-direction. The global bit line 10 is formed from e.g. polysilicon.

A wiring selecting part 20 is provided on the global bit line 10. A memory part 30 is provided on the wiring selecting part 20.

As shown in FIGS. 1, 2A, and 2B, the wiring selecting part 20 includes a plurality of silicon pillars 21. The plurality of silicon pillars 21 are arranged like a matrix along the X-direction and the Y-direction. Each silicon pillar 21 extends in the Z-direction. A plurality of silicon pillars 21 arranged along the X-direction are commonly connected to one global bit line 10. Each silicon pillar 21 is shaped like a generally quadrangular prism. Thus, in the X-Y cross section, the silicon pillar 21 is shaped like a rectangle.

Each silicon pillar 21 includes an $n^+$-type portion 22, a $p^-$-type portion 23, and an $n^+$-type portion 24 arranged in this order along the Z-direction from the lower side, i.e., the global bit line 10 side. Here, the relationship between the n-type and the p-type may be reversed. The $p^-$-type portion 23 can be replaced by an $n^-$-type portion.

The $n^+$-type portions 22 and 24 are formed from e.g. polysilicon doped with impurity serving as a donor. The $p^-$-type portion 23 is formed from e.g. polysilicon doped with impurity serving as an acceptor. The effective impurity concentration of the $p^-$-type portion 23 is lower than the effective impurity concentration of the $n^+$-type portions 22 and 24. The effective impurity concentration refers to the concentration of impurity contributing to the conduction of the semiconductor material. For instance, in the case where the semiconductor material contains both the impurity serving as a donor and the impurity serving as an acceptor, the effective impurity concentration refers to the concentration except the donor and the acceptor canceling each other.

A gate electrode 25 extending in the Y-direction is provided between the silicon pillars 21 in the X-direction. The gate electrodes 25 are located at nearly the same position in the Z-direction. The gate electrode 25 is formed from e.g. polysilicon. As viewed in the X-direction, the gate electrode 25 overlaps an upper part of the $n^+$-type portion 22, the entirety of the $p^-$-type portion 23, and a lower part of the $n^+$-type portion 24. That is, the lower surface of the gate electrode 25 is located below the interface between the $n^+$-type portion 22 and the $p^-$-type portion 23. The upper surface of the gate electrode 25 is located above the interface between the $p^-$-type portion 23 and the $n^+$-type portion 24.

A barrier metal layer (not shown) can be provided on the upper surface of the silicon pillar 21. The barrier metal layer is e.g. a stacked film in which a lower layer made of titanium silicide (TiSi) and an upper layer made of titanium nitride (TIN) are stacked.

A dielectric member 26 made of e.g. silicon nitride ($Si_3N_4$) and having a relatively high permittivity is placed in the entirety of the space 39 between the silicon pillars 21 adjacent in the Y-direction. A gate insulating film 27 made of e.g. silicon oxide ($SiO_2$) is placed between the silicon pillar 21 and the gate electrode 25 and between the dielectric member 26 and the gate electrode 25. The gate insulating film 27 is shaped like a strip spread along the Y-Z plane and extending in the Y-direction. The permittivity of the insulating material forming the dielectric member 26 such as silicon nitride is higher than the permittivity of the insulating material forming the gate insulating film 27 such as silicon oxide.

The silicon pillar 21 including the $n^+$-type portion 22, the $p^-$-type portion 23, and the $n^+$-type portion 24, the dielectric member 26, the gate insulating film 27, and the gate electrode 25 constitute e.g. an n-channel type TFT 29.

The memory part 30 includes a plurality of local bit lines 31. The plurality of local bit lines 31 are arranged like a matrix along the X-direction and the Y-direction. Each local bit line 31 extends in the Z-direction. The lower end of each local bit line 31 is connected to the upper end of the corresponding silicon pillar 21. The local bit line 31 is formed from e.g. polysilicon.

A resistance change film 32 as a memory element is provided on two side surfaces directed to both sides in the X-direction of each local bit line 31. The resistance change film 32 is made of e.g. metal oxide. For instance, upon application of a voltage of a certain level or more, filaments are formed inside, and the resistance change film 32 turns to a low resistance state. Upon application of a voltage with polarity opposite thereto, the filaments are broken, and the resistance change film 32 turns to a high resistance state.

Specifically, the resistance change film 32 can be formed from a thin film made of one of such materials as HfO, $TiO_2$, $ZnMn_2O_4$, NiO, $SrZrO_3$, $Pr_{0.7}Ca_{0.3}MnO_3$, and carbon (C). Alternatively, the resistance change film 32 can be made of polycrystalline or amorphous silicon (Si), or germanium (Ge), SiGe, GaAs, InP, GaP, GaInAsP, GaN, SiC, SiO, SiON, SiN, HfSiO, AlO or the like. Alternatively, the resistance change film 32 can be a stacked film in which layers made of the aforementioned materials are stacked.

An electrode made of e.g. Ag, Au, Ti, Ni, Co, Al, Fe, Cr, Cu, W, Hf, Ta, Pt, Ru, Zr, or Ir, or a nitride, carbide or the like thereof may be placed between the resistance change film 32 and the silicon pillar 21. The material of this electrode may be polycrystalline silicon to which the aforementioned materials are added.

A plurality of local word lines 33 are provided between the local bit lines 31 adjacent in the X-direction and between the resistance change films 32. The plurality of local word lines 33 are arranged like a matrix along the X-direction and the Z-direction. Each local word line 33 extends in the Y-direction. Each local word line 33 is in contact with the respective resistance change films 32 on both sides in the X-direction. In particular, a plurality of local word lines 33 arranged in a line along the Z-direction are in contact with a common resistance change film 32.

One local bit line 31, one local word line 33, and a portion of the resistance change film 32 sandwiched therebetween constitute a memory cell 35. Thus, a plurality of memory cells 35 are series connected to one TFT 29. In the memory part 30 as a whole, a plurality of memory cells 35 are arranged like a three-dimensional matrix along the X-direction, the Y-direction, and the Z-direction.

In the integrated circuit device 1, an interlayer insulating film 11 is provided so as to embed the global bit lines 10, the silicon pillars 21, the gate electrodes 25, the dielectric members 26, the gate insulating films 27, the local bit lines 31, the resistance change films 32, and the local word lines 33.

Next, a method for manufacturing the integrated circuit device 1 according to the embodiment is described.

FIGS. 3A to 6B are perspective views illustrating the method for manufacturing an integrated circuit device according to the embodiment.

Figure 3A:
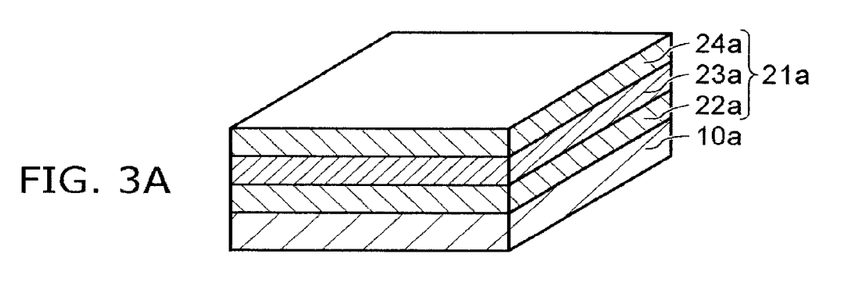

First, as shown in FIG. 3A, an insulating film (not shown) is formed on a silicon substrate (not shown). A conductive film 10a is formed on the insulating film. The conductive film 10a is formed from e.g. amorphous silicon. Next, silicon is deposited while introducing impurity to form an $n^+$-type film 22a, a $p^-$-type film 23a, and an $n^+$-type film 24a in this order on the conductive film 10a. The $n^+$-type film 22a, the $p^-$-type film 23a, and the $n^+$-type film 24a form a silicon stacked film 21a. Next, the conductive film 10a and the silicon stacked film 21a are crystallized by heat treatment.

Figure 3B:
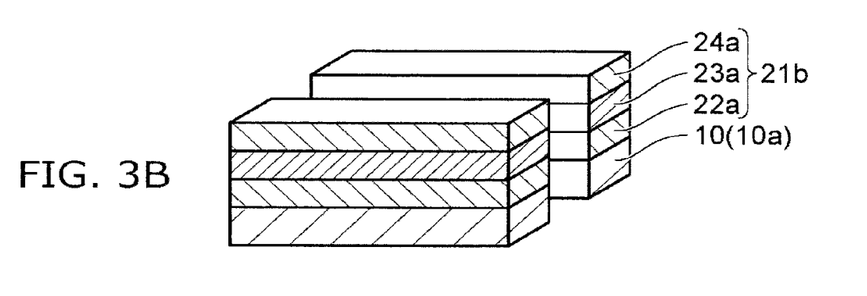

Next, as shown in FIG. 3B, the silicon stacked film 21a and the conductive film 10a are patterned into a line-and-space pattern extending in the X-direction by lithography technique and RIE (Reactive Ion Etching) technique. Thus, the conductive film 10a is processed into a plurality of global bit lines 10 extending in the X-direction, and the silicon stacked film 21a is processed into a plurality of silicon stacked bodies 21b extending in the X-direction. Each silicon stacked body 21b is placed directly above the corresponding global bit line 10.

Figure 3C:
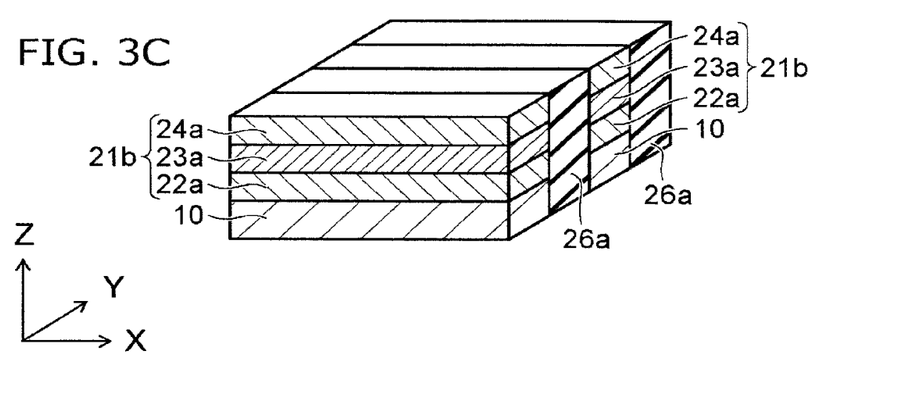

Next, as shown in FIG. 3C, a material having a relatively high permittivity such as silicon nitride is embedded between the adjacent global bit lines 10 and between the adjacent silicon stacked bodies 21b to form a dielectric film 26a shaped like a line extending in the X-direction. The dielectric films 26a and the stacked bodies composed of the global bit lines 10 and the silicon stacked bodies 21b are arranged alternately in the Y-direction.

Figure 4A:
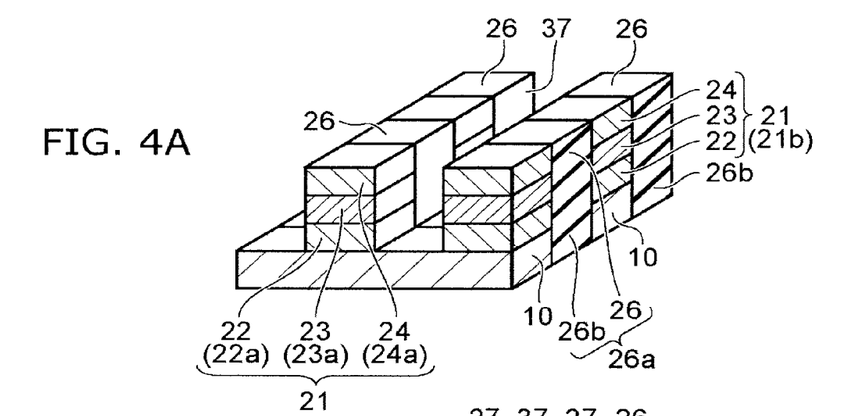

Next, as shown in FIG. 4A, the silicon stacked body 21b is patterned into a line-and-space pattern extending in the Y-direction by lithography technique and RIE technique. Thus, the silicon stacked body 21b shaped like a line extending in the X-direction is divided along the X-direction into a plurality of silicon pillars 21 extending in the Z-direction. At this time, the $n^+$-type film 22a, the $p^-$-type film 23a, and the $n^+$-type film 24a constitute an $n^+$-type portion 22, a $p^-$-type portion 23, and an $n^+$-type portion 24, respectively. The silicon pillars 21 are arranged like a matrix along the X-direction and the Y-direction on the plurality of global bit lines 10.

Subsequently, an upper part of the dielectric film 26a, i.e., the portion of the dielectric film 26a located between the silicon stacked bodies 21b, is patterned into a line-and-space pattern extending in the Y-direction by RIE technique using the same mask. Thus, the upper part of the dielectric film 26a extending in the X-direction is also divided along the X-direction into a plurality of dielectric members 26. A trench 37 is formed between the stacked bodies in which the silicon pillars 21 and the dielectric members 26 are arranged alternately along the Y-direction.

Here, the order of processing the silicon stacked body 21b and the dielectric film 26a can be reversed. Furthermore, etching of the silicon stacked body 21b and the dielectric film 26a can be performed simultaneously.

On the other hand, a lower part of the dielectric film 26a, i.e., the portion of the dielectric film 26a located between the global bit lines 10, is not divided but left as an inter-wiring insulating film 26b extending in the X-direction. The global bit lines 10 and the inter-wiring insulating films 26b are arranged alternately along the Y-direction and constitute a global bit line wiring layer.

Figure 4B:
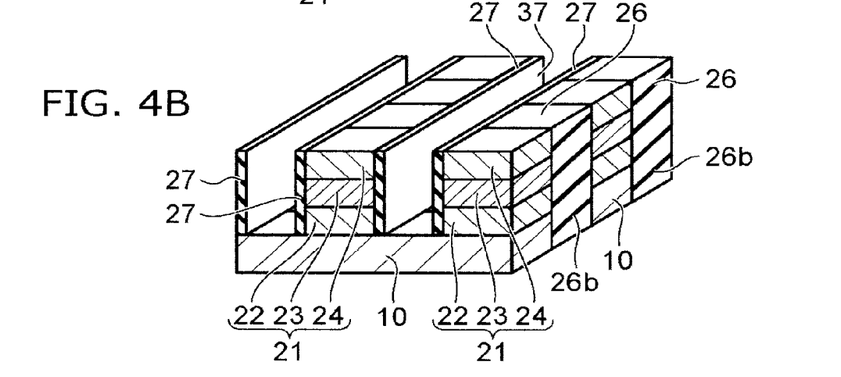

Next, as shown in FIG. 4B, an insulating film is formed by depositing an insulating material having a relatively low permittivity on the entire surface. Here, the insulating film is conformally formed without filling the trench 37. The permittivity of the insulating material used at this time is lower than the permittivity of the material of the dielectric film 26a. In the embodiment, the material having a relatively low permittivity is e.g. silicon oxide. Next, etch-back is performed. Thus, the portion of the insulating film deposited on the upper surface of the global bit line 10, on the upper surface of the dielectric film 26a, and on the upper surface of the silicon pillar 21 is removed, and the portion deposited on the side surface of the trench 37 is left. Accordingly, a gate insulating film 27 is formed on the side surface of the trench 37.

Figure 4C:
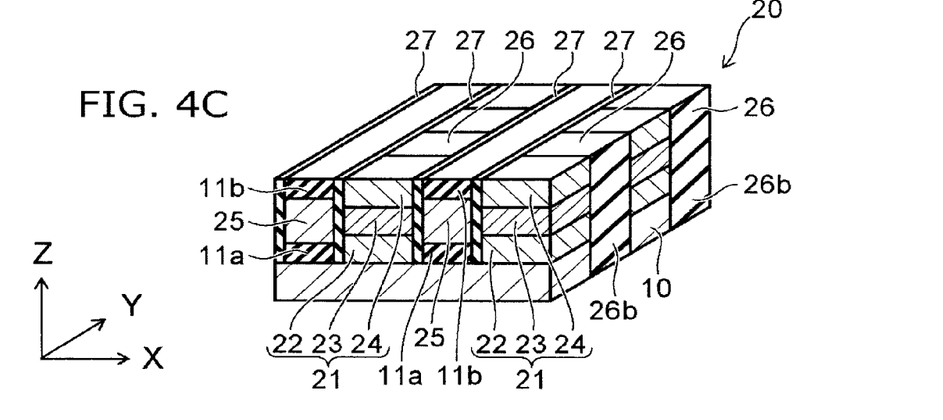

Next, as shown in FIG. 4C, an insulating material such as silicon oxide is deposited on the entire surface and etched back to embed an interlayer insulating film 11a in an lower portion of the trench 37. At this time, the upper surface of the interlayer insulating film 11a is placed slightly below the interface between the $n^+$-type portion 22 and the $p^-$-type portion 23. Next, a conductive material such as impurity-containing silicon is deposited on the entire surface and etched back to form a gate electrode 25 on the interlayer insulating film 11a in the trench 37. At this time, the upper surface of the gate electrode 25 is placed slightly above the interface between the $p^-$-type film 23a and the $n^+$-type film 24a. Next, an insulating material such as silicon oxide is deposited on the entire surface and subjected to CMP (Chemical Mechanical Polishing) to embed an interlayer insulating film 11b on the gate electrode 25 in the trench 37. Thus, a wiring selecting part 20 is formed on the global bit line wiring layer.

Figure 5A:
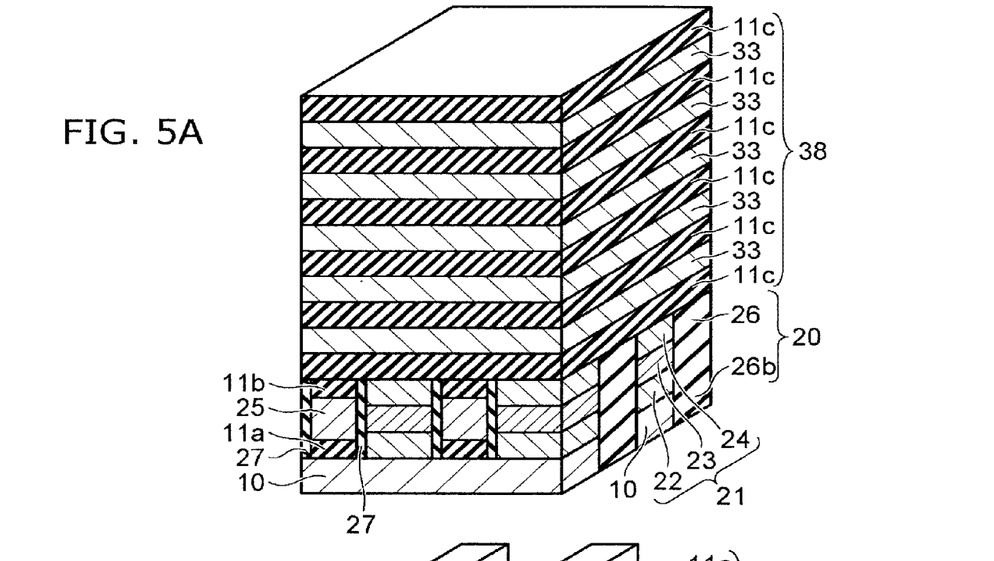

Next, as shown in FIG. 5A, interlayer insulating films 11c and wiring films 33a are alternately stacked on the wiring selecting part 20 to form a stacked film 38.

Figure 5B:
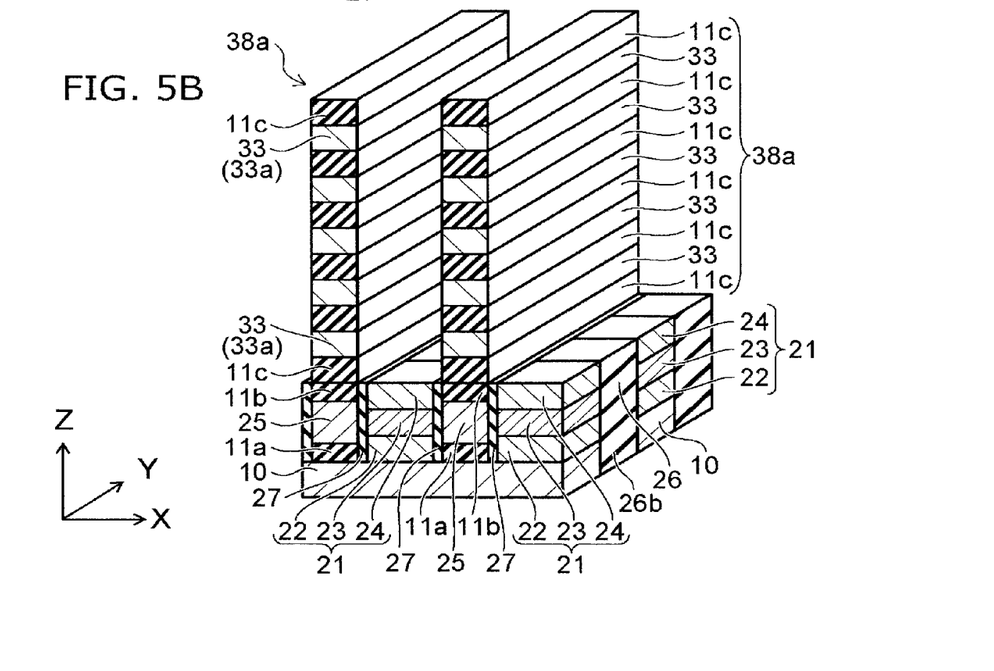

Next, as shown in FIG. 5B, the stacked film 38 is divided into a plurality of stacked bodies 38a extending in the Y-direction by lithography technique and RIE technique. Each stacked body 38a is placed directly above the corresponding gate wiring 25. Thus, the wiring film 33a is divided into a plurality of local word lines 33 extending in the Y-direction.

Figure 6A:
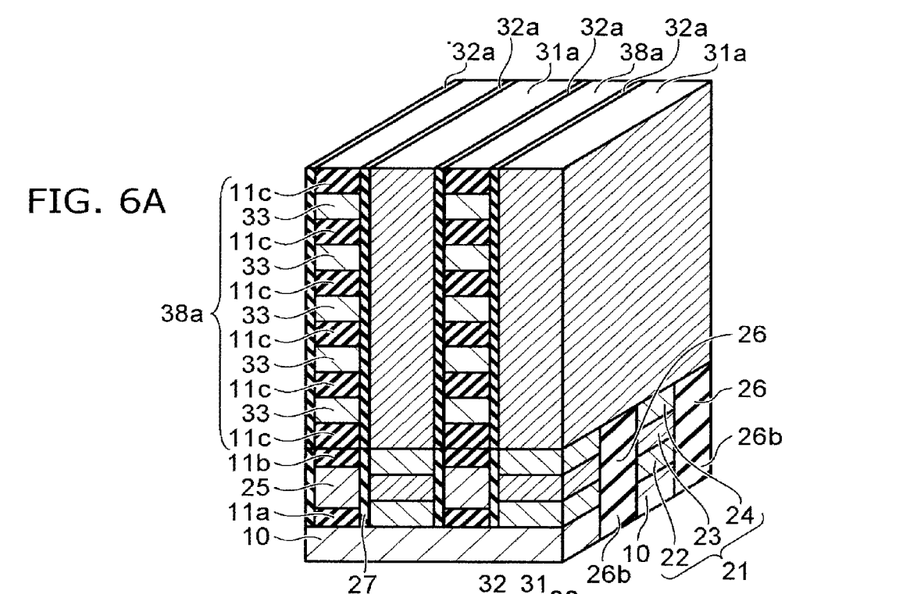

Next, as shown in FIG. 6A, a resistance change material such as metal oxide is deposited on the entire surface and etched back to form a resistance change material film 32a on the side surface of the stacked body 38a. Next, a conductive material such as impurity-containing silicon is deposited on the entire surface and subjected to CMP to embed a conductive film 31a between the stacked bodies 38a.

Figure 6B:
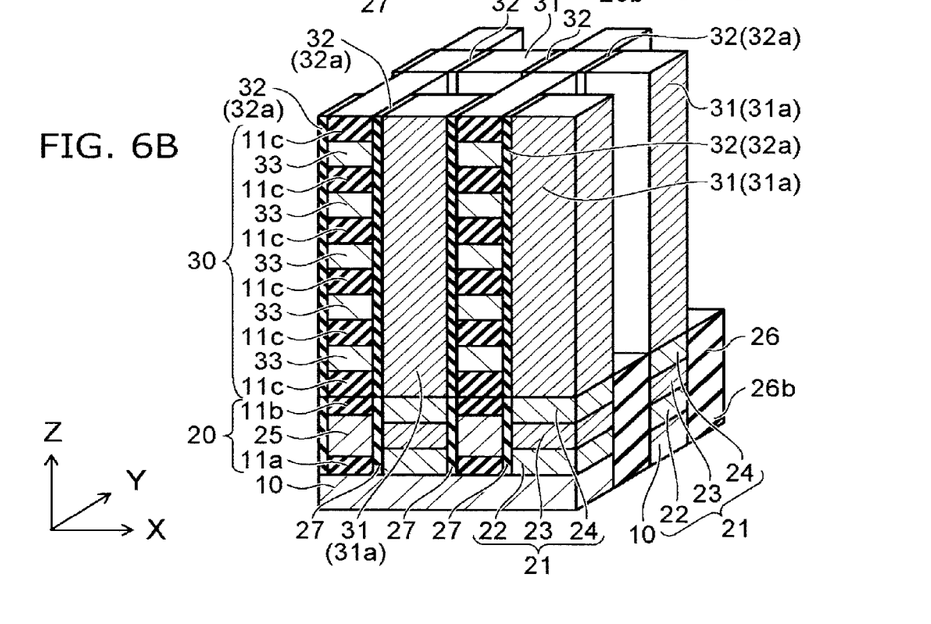

Next, as shown in FIG. 6B, the conductive film 31a and the resistance change material film 32a are selectively removed by lithography technique and RIE technique and divided along the Y-direction. Thus, the conductive film 31a is divided into a plurality of local bit lines 31 extending in the Z-direction, and the resistance change material film 32a is divided into a plurality of resistance change films 32 extending in the Z-direction. Next, an interlayer insulating film (not shown) is embedded between the structural bodies composed of the local bit lines 31 and the resistance change films 32. Thus, a memory part 30 is formed.

Thus, the integrated circuit device 1 shown in FIG. 1 is manufactured. Here, the interlayer insulating films 11a, 11b, and 11c constitute part of the interlayer insulating film 11.

Next, the operation and effect of the embodiment are described.

Figure 7:
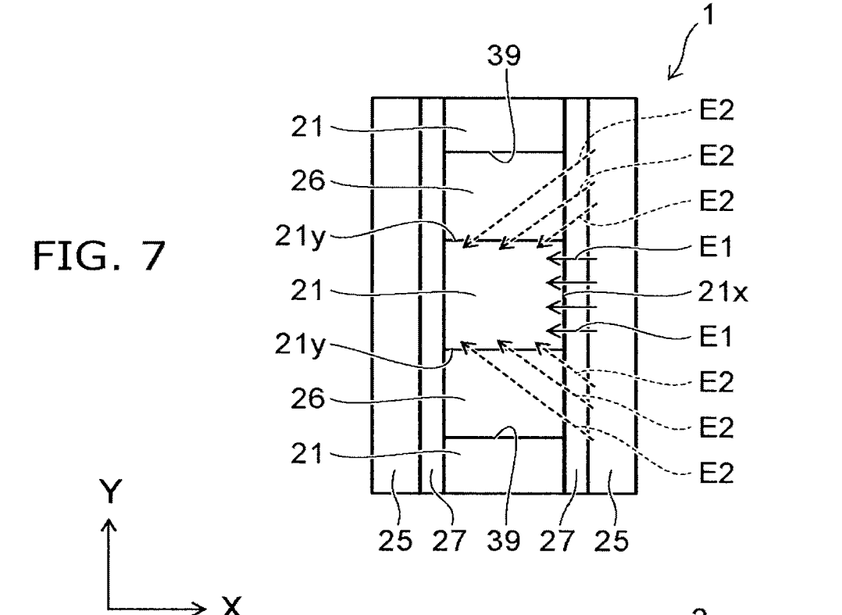
FIG. 7 is a sectional view illustrating an operation of the integrated circuit device according to the first embodiment.

FIG. 7 is a sectional view illustrating the operation of the integrated circuit device according to the embodiment.

As shown in FIG. 7, in the integrated circuit device 1 according to the embodiment, electrical continuity of the silicon pillar 21 is controlled by the electric field generated from the gate electrode 25. At this time, the silicon pillar 21 is controlled not only by the lines of electric force E1 injected from the gate electrode 25 into the side surface 21x of the silicon pillar 21 opposed to the gate electrode 25, but also by the lines of electric force E2 injected from the gate electrode 25 into the side surface 21y of the silicon pillar 21 not opposed to the gate electrode 25. The lines of electric force E2 pass through the dielectric member 26. Thus, the electrical distance traversed by the lines of electric force E2 is made shorter by increasing the permittivity of the dielectric member 26. This strengthens the control power of the gate electrode 25 over the silicon pillar 21.

Thus, the embodiment increases the portion of the silicon pillar 21 capable of forming a channel by the gate electrode 25, and increases the effective gate width. As a result, the on-current flowing at the time of turning on the TFT 29 is increased, and the off-current flowing at the time of turning off the TFT 29 is decreased. Thus, the ratio of on-current to off-current in the silicon pillar 21 can be increased, and the operation margin is expanded. As a result, the operation of the integrated circuit device 1 is stabilized. Here, for convenience of illustration, FIG. 7 shows only the lines of electric force E1 and E2 originating from the gate electrode 25 located on the right side in the figure as viewed from the silicon pillar 21. However, the lines of electric force E1 and E2 originate also from the gate electrode 25 located on the left side.

On the other hand, the gate insulating film 27 is formed from a material having low permittivity such as silicon oxide. This can suppress leakage current through the gate insulating film 27 between the gate electrode 25 and the silicon pillar 21.

Furthermore, according to the embodiment, the dielectric member 26 is placed in the entirety of the space 39 between the silicon pillars 21 adjacent in the Y-direction. Thus, most of the lines of electric force E2 pass through the dielectric member 26. This can reduce more effectively the electrical distance between the gate electrode 25 and the silicon pillar 21.

Furthermore, according to the embodiment, in the step shown in FIG. 3C, the dielectric member 26 having a relatively high permittivity can be embedded in the space 39 simply by depositing a material having a relatively high permittivity between the silicon stacked bodies 21b. Thus, the number of steps is not significantly increased by the formation of the dielectric member 26. Accordingly, the cost of manufacturing the integrated circuit device 1 is not significantly increased.

Second Embodiment

Next, a second embodiment is described.

Figure 8:
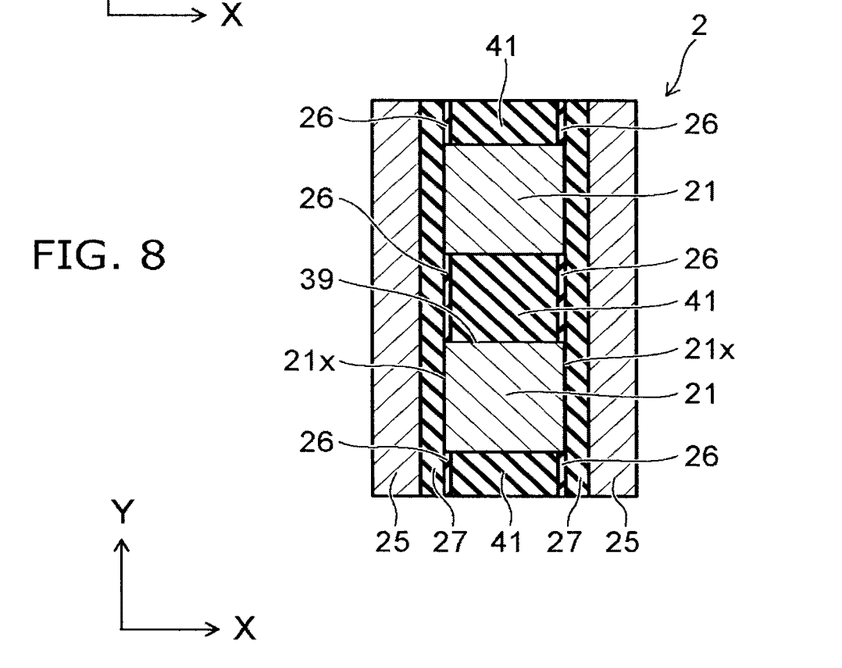
FIG. 8 is a sectional view illustrating an integrated circuit device according to a second embodiment.

FIG. 8 is a sectional view illustrating an integrated circuit device according to the embodiment.

FIG. 8 shows a region corresponding to the region RB shown in FIG. 1.

As shown in FIG. 8, in the integrated circuit device 2 according to the embodiment, an insulating member 41 is provided in the space 39 between the silicon pillars 21 adjacent in the Y-direction. The insulating member 41 is made of an insulating material having a lower permittivity than the material of the dielectric member 26. The insulating member 41 is made of e.g. silicon oxide. The dielectric members 26 are placed at two positions sandwiching the insulating member 41 in the X-direction. That is, each dielectric member 26 is placed between the insulating member 41 and the gate insulating film 27. Each dielectric member 26 is shaped like a film spread in the YZ-direction. The dielectric member 26 is located generally on the extension plane of the side surface 21x directed to the X-direction of the silicon pillar 21.

Next, a method for manufacturing the integrated circuit device according to the embodiment is described.

Figure 9A:
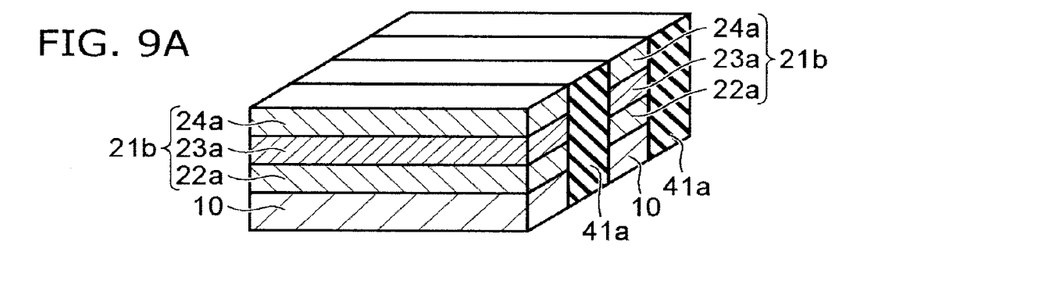
FIGS. 9A to 9C are perspective views illustrating a method for manufacturing the integrated circuit device according to the second embodiment.
Figure 9B:
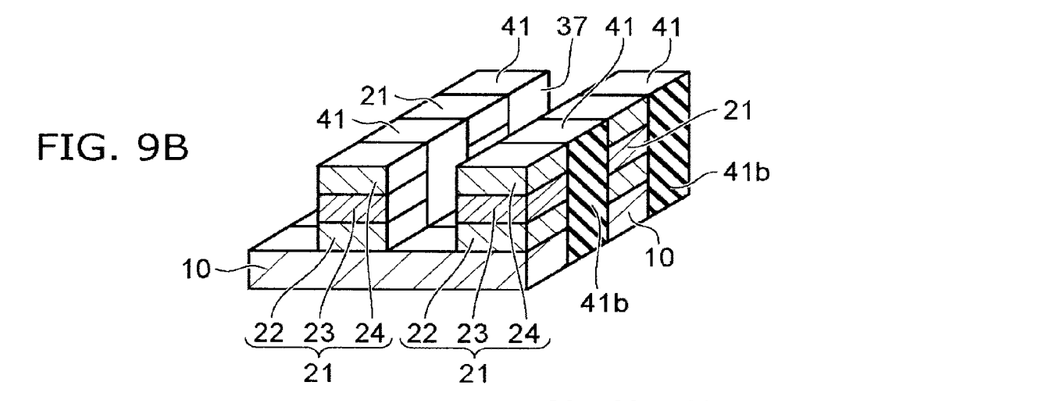
Figure 9C:
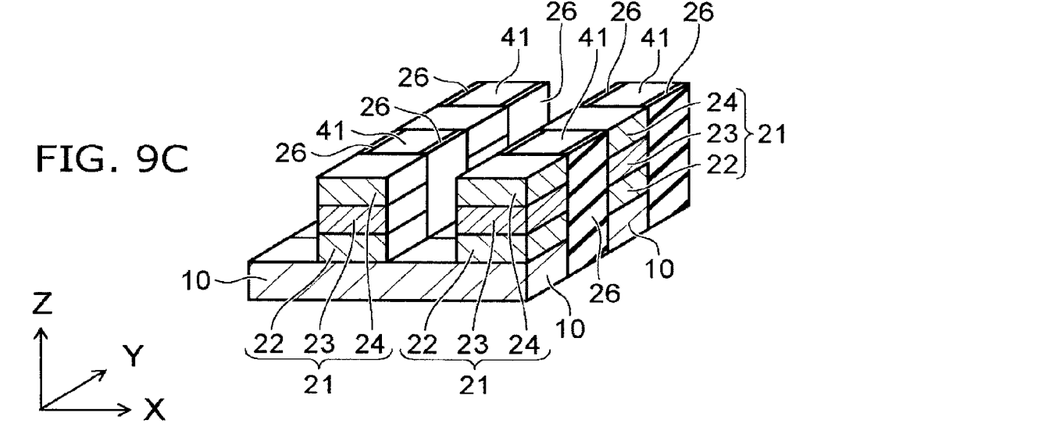

FIGS. 9A to 9C are perspective views illustrating the method for manufacturing an integrated circuit device according to the embodiment.

First, the steps shown in FIGS. 3A and 3B are performed.

Next, as shown in FIG. 9A, an insulating material such as silicon oxide is embedded between the adjacent global bit lines 10 and between the adjacent silicon stacked bodies 21b to form an insulating film 41a shaped like a line extending in the X-direction.

Next, as shown in FIG. 9B, the silicon stacked body 21b, and an upper part of the insulating film 41a, i.e., the portion located between the silicon stacked bodies 21b, are selectively removed and patterned into a line-and-space pattern extending in the Y-direction by lithography technique and RIE technique. Thus, the silicon stacked body 21b is divided along the X-direction into a plurality of silicon pillars 21. The upper part of the insulating film 41a is also divided along the X-direction into a plurality of insulating members 41. A trench 37 is formed between the stacked bodies in which the silicon pillars 21 and the insulating members 41 are arranged alternately along the Y-direction. On the other hand, the lower part of the insulating film 41a is not divided but left as an inter-wiring insulating film 41b extending in the X-direction.

Next, nitridation treatment is performed by e.g. heating in a nitrogen atmosphere. Thus, the exposed portion of the global bit line 10, the silicon pillar 21, and the insulating film 41a is nitridized.

Next, as shown in FIG. 9C, etch-back is performed. Thus, the nitridized portion formed on the upper surface of the global bit line 10, the upper surface of the inter-wiring insulating film 41b, and the upper surface and the side surface of the silicon pillar 21 is removed. At this time, the nitridized portion formed on the side surface of the insulating member 41 remains. This remaining portion constitutes a dielectric member 26. As a result, the dielectric member 26 having a relatively high permittivity is formed on both side surfaces in the X-direction of the insulating member 41. Here, the dielectric member 26 is a silicon nitride film or silicon oxynitride film.

Next, the steps shown in FIGS. 4B to 6B are performed. Thus, the integrated circuit device 2 according to the embodiment is manufactured.

Next, the operation and effect of the embodiment are described.

In the embodiment, compared with the above first embodiment, an insulating member 41 having a relatively low permittivity is provided in the space 39 between the silicon pillars 21. By this amount, the volume of the dielectric member 26 is smaller than that of the first embodiment. This can further reduce the leakage current between the silicon pillar 21 and the gate electrode 25.

The configuration, manufacturing method, operation, and effect of the embodiment other than the foregoing are similar to those of the above first embodiment.

Third Embodiment

Next, a third embodiment is described.

Figure 10:
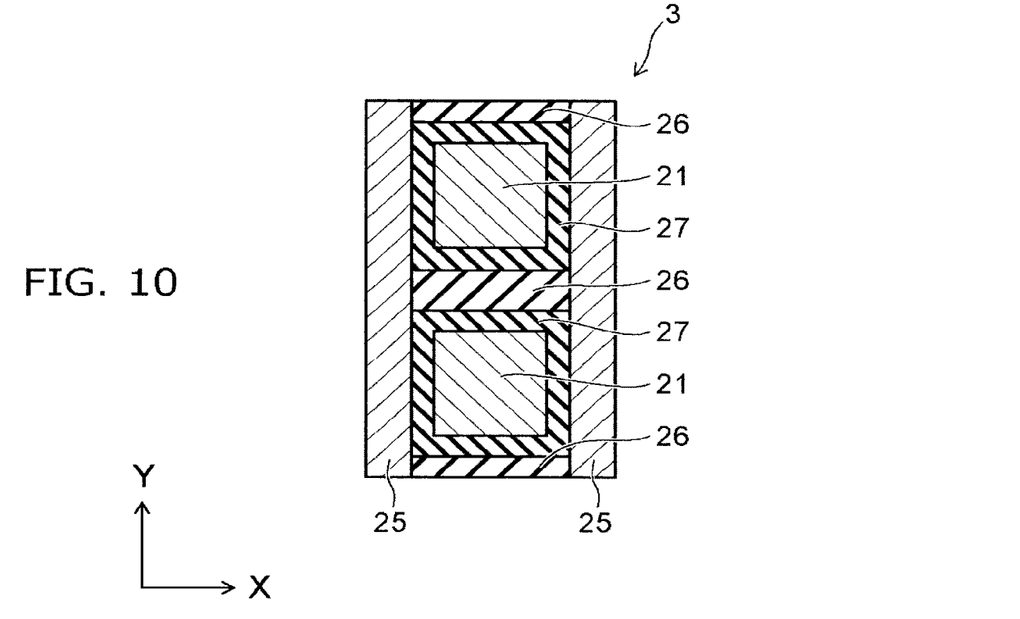
FIG. 10 is a sectional view illustrating an integrated circuit device according to a third embodiment.

FIG. 10 is a sectional view illustrating an integrated circuit device according to the embodiment.

FIG. 10 shows a region corresponding to the region RB shown in FIG. 1.

As shown in FIG. 10, in the integrated circuit device 3 according to the embodiment, in contrast to the integrated circuit device 1 (see FIG. 2B) according to the above first embodiment, the gate insulating film 27 is placed so as to surround the silicon pillar 21 in the X-Y cross section. As a result, the dielectric member 26 is separated from the silicon pillar 21. Furthermore, the dielectric member 26 is in contact with the gate electrode 25.

In the embodiment, the silicon pillar 21 is surrounded with the gate insulating film 27 and separated from the dielectric member 26. Thus, the control power of the gate electrode 25 over the silicon pillar 21 can be enhanced by interposing the dielectric member 26 in the path of the lines of electric force E2. Furthermore, the leakage current between the silicon pillar 21 and the gate electrode 25 can be suppressed more reliably.

The manufacturing method of the third embodiment can be realized by e.g. modifying the manufacturing method of the first embodiment as follows. The process up to the step of FIG. 4A is the same as that of the first embodiment. After the step of FIG. 4A, the dielectric film 26a is removed, and a gate insulating film 27 is formed as in the step of FIG. 4B. Subsequently, a dielectric film 26a is deposited on the entire surface and processed so as to remain only between the silicon pillars 21 adjacent in the Y-direction. The subsequent process is the same as that of the first embodiment. The configuration, manufacturing method, operation, and effect of the embodiment other than the foregoing are similar to those of the above first embodiment.

Fourth Embodiment

Next, a fourth embodiment is described.

Figure 11:
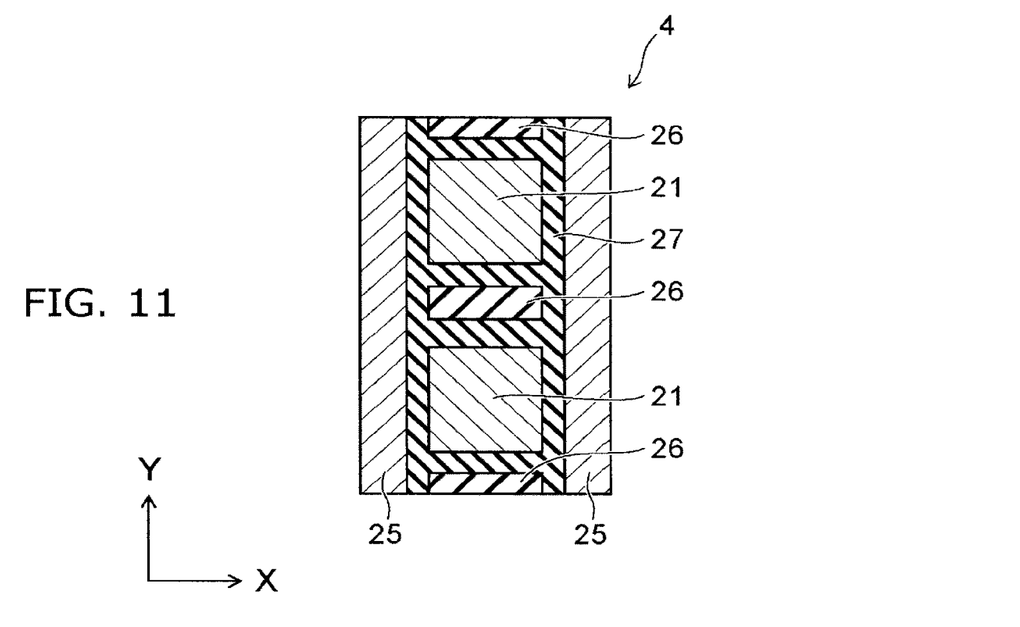
FIG. 11 is a sectional view illustrating an integrated circuit device according to a fourth embodiment.

FIG. 11 is a sectional view illustrating an integrated circuit device according to the embodiment.

FIG. 11 shows a region corresponding to the region RB shown in FIG. 1.

As shown in FIG. 11, in the integrated circuit device 4 according to the embodiment, the dielectric member 26 is surrounded with the gate insulating film 27. As a result, the dielectric member 26 is not in contact with the gate electrode 25.

According to the embodiment, the dielectric member 26 is not brought into contact with either the silicon pillar 21 or the gate electrode 25. Thus, the leakage current between the silicon pillar 21 and the gate electrode 25 can be reduced more reliably.

The structure of the fourth embodiment can be manufactured by combining the manufacturing method of the second embodiment and the manufacturing method of the third embodiment. The configuration, manufacturing method, operation, and effect of the embodiment other than the foregoing are similar to those of the above third embodiment.

Fifth Embodiment

Next, a fifth embodiment is described.

The embodiment is an example of applying the wiring selecting part 20 in the above first and second embodiments to an MRAM (Magnetoresistive Random Access Memory).

Figure 12:
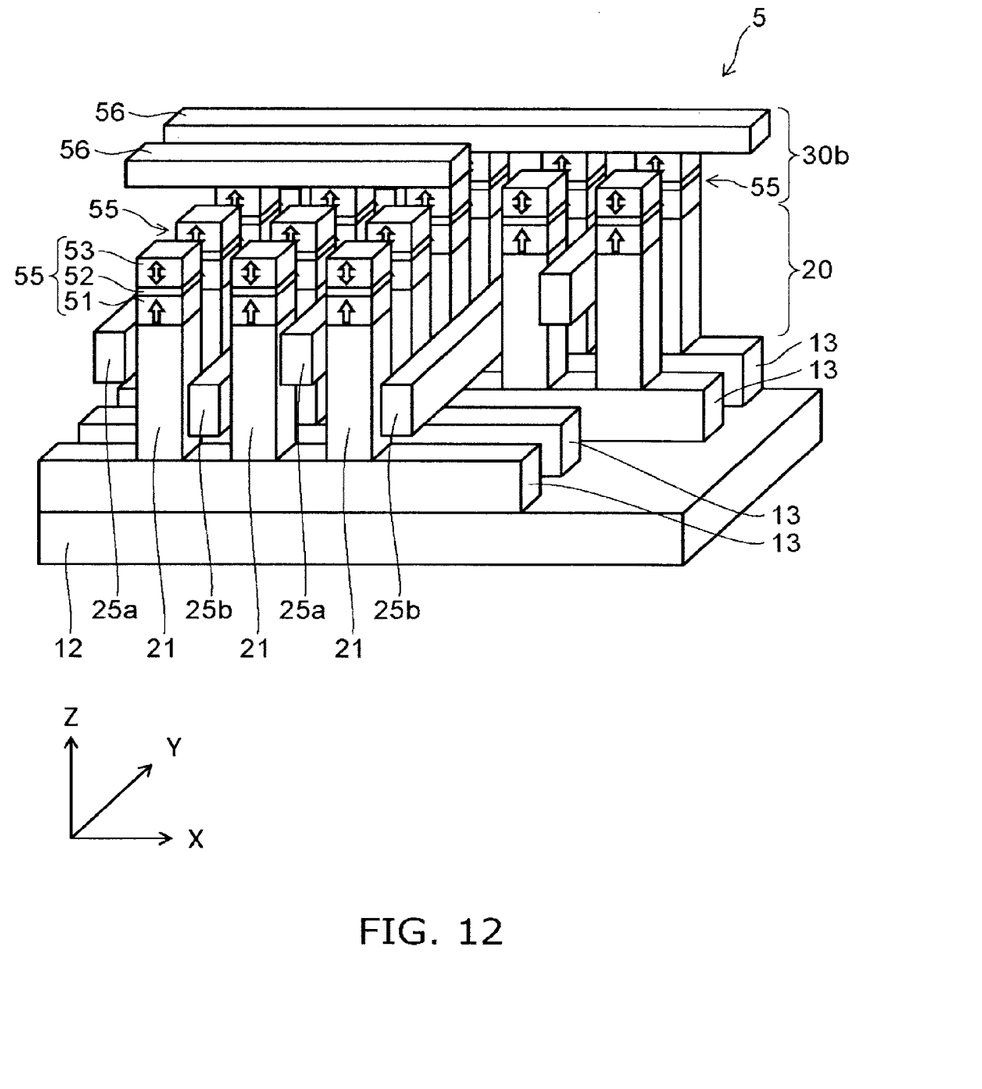
FIG. 12 is a perspective view illustrating an integrated circuit device according to a fifth embodiment.

FIG. 12 is a perspective view illustrating an integrated circuit device according to the embodiment.

As shown in FIG. 12, in the integrated circuit device 5 according to the embodiment, an upper portion of a monocrystalline silicon substrate 12 is processed into a plurality of local source lines 13. The plurality of local source lines 13 are arranged periodically along the Y-direction. Each local source line 13 extends in the X-direction. The local source lines 13 are electrically isolated from each other by STI (Shallow Trench Isolation), buried insulating film, or impurity concentration profile like the conventional device isolation. The plurality of local source lines 13 may be collected into a single line.

A wiring selecting part 20 as in the above first embodiment is provided on the wiring layer including the plurality of local source lines 13. In the embodiment, the channel of the wiring selecting part 20 is formed by directly processing the silicon substrate 12. Thus, the channel is formed from monocrystalline silicon. This can increase the on-current compared with the case of forming the channel from polysilicon.

In the integrated circuit device 5, a memory part 30b is provided on the wiring selecting part 20. In the memory part 30b, an MTJ (Magnetic Tunnel Junction) element 55 is provided as a memory element on each semiconductor member 21. The MTJ element 55 is a kind of magnetoresistive elements. In the MTJ element 55, a pinned layer 51 connected to the semiconductor member 21 and made of a perpendicular magnetization film with a pinned magnetization direction, an insulating layer 52, and a memory layer 53 made of a perpendicular magnetization film with a movable magnetization direction are stacked in this order from the lower side. A local bit line 56 extending in the X-direction is provided on the MTJ element 55. Each local bit line 56 is placed directly above the corresponding local source line 13. The local bit lines 56 are commonly connected to the memory layers 53 of a plurality of MTJ elements 55 arranged in a line along the X-direction.

The configuration, manufacturing method, operation, and effect of the embodiment other than the foregoing are similar to those of the above first embodiment.

The above embodiments have been described with reference to the example in which the gate insulating film 27 is made of silicon oxide and the dielectric member 26 is made of silicon nitride. However, the combination of the materials of the gate insulating film 27 and the dielectric member 26 is not limited thereto as long as the permittivity of the high permittivity (high-k) material forming the dielectric member 26 is higher than the permittivity of the low permittivity film forming the gate insulating film 27. For instance, in the case where the gate insulating film 27 is made of silicon oxide, the material of the dielectric member 26 may be hafnium oxide ($HfO_2$), aluminum oxide ($Al_2O_3$), or silicon oxynitride film (SiON).

The above embodiments have been described with reference to the example in which the gate insulating film 27 is a monolayer film. However, the gate insulating film may be a multilayer film. In this case, the dielectric member 26 is made of a material having a higher permittivity than the material of the thickest of the layers constituting the gate insulating film 27.

The above embodiments have been described with reference to the example in which the resistance change film 32 is provided as a memory element. However, the memory element is not limited thereto. For instance, the memory element may be a PRAM (Phase Random Access Memory) element.

(Test Example)

Next, a test example illustrating the effect of the above first embodiment is described.

Figure 13A:
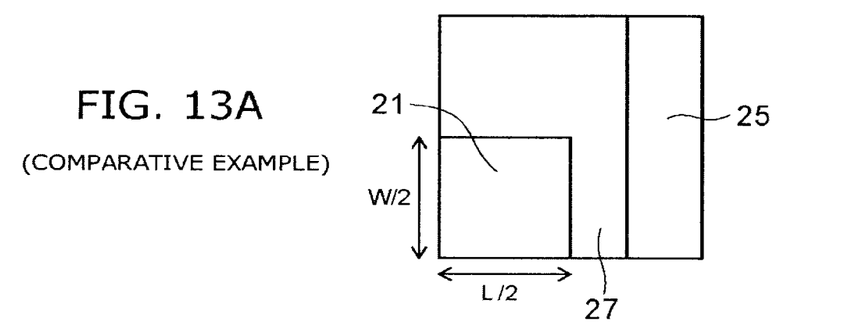
FIG. 13A shows the comparative example.
Figure 13B:
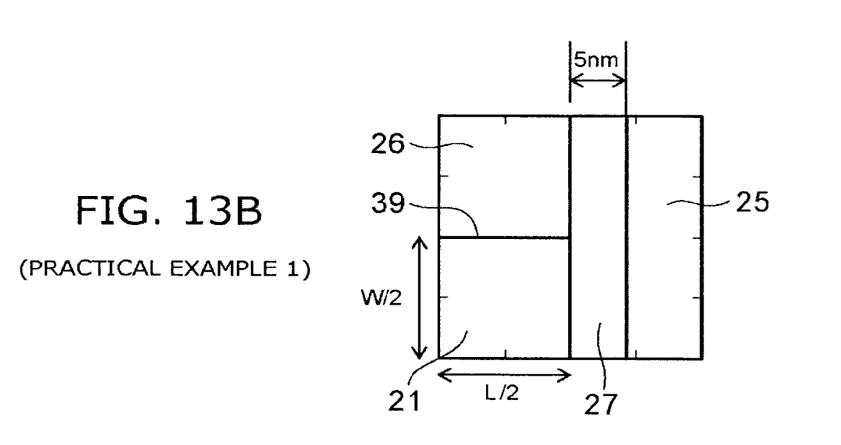
FIG. 13B shows the practical example 1.
Figure 13C:
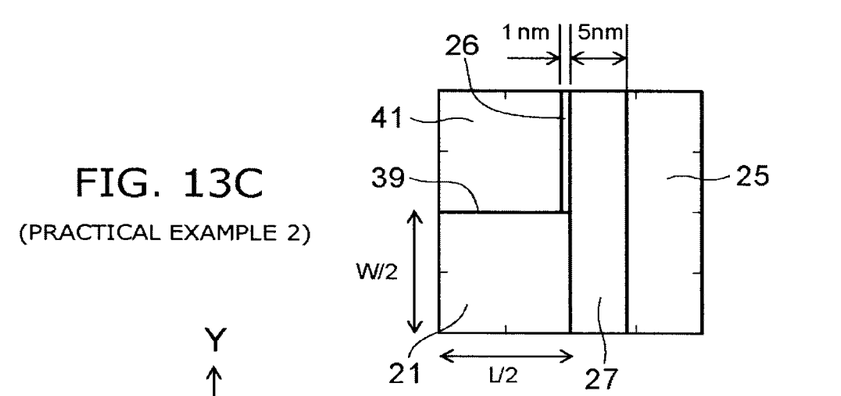
FIG. 13C shows the practical example 2.

FIGS. 13A to 13C show simulation conditions in the test example. FIG. 13A shows the comparative example. FIG. 13B shows the practical example 1. FIG. 13C shows the practical example 2. The practical example 1 is a practical example of the first embodiment. The practical example 2 is a practical example of the second embodiment.

The common condition is shown in TABLE 1.

TABLE 1

| | |
|---|---|
| Material of silicon pillar 21 | Silicon (Si) |
| Material of gate insulating film 27 | Silicon oxide ($SiO_2$) |
| Material of dielectric member 26 | Silicon nitride ($Si_3N_4$) |
| Material of insulating member 41 | Silicon oxide ($SiO_2$) |
| Material of gate electrode 25 | Polysilicon |
| Cross-sectional shape of silicon pillar 21 | Rectangle |
| X-direction length (L) of silicon pillar 21 | 24, 48 nm (2 levels) |
| Y-direction length (W) of silicon pillar 2) | 24 nm (1 level) |
| Thickness of gate insulating film 27 | 5 nm |

As shown in FIGS. 13A to 13C and TABLE 1, in the test example, the silicon pillar 21 was assumed to be a silicon pillar with a cross section shaped like a square or rectangle. The gate insulating film 27 was assumed to be a film made of silicon oxide. The dielectric member 26 was assumed to be a member made of silicon nitride. The gate electrode 25 was assumed to be an electrode made of polysilicon. The film thickness of the gate insulating film 27, i.e., the distance between the silicon pillar 21 and the gate electrode 25, was set to 5 nm.

The comparative example was assumed to have a shape in which the dielectric member 26 is not provided. The practical example 1 was assumed to have a shape in which a block-shaped dielectric member 26 is provided in the entirety of the space 39 between the silicon pillars 21 adjacent in the Y-direction. The practical example 2 was assumed to have a shape in which an insulating member 41 made of silicon oxide is provided in the space 39 and a dielectric member 26 is provided like a film at two positions sandwiching the insulating member 41 in the X-direction. The thickness of the dielectric member 26 in the practical example 2 was set to 1 nm.

Simulation was performed under this condition to calculate the on-current and the off-current flowing in each silicon pillar 21. The result is shown in TABLE 2.

TABLE 2

| | Gate width W (nm) | Comparative example Without high-k member | Practical example 1 With high-k member (block-shaped) | Practical example 2 With high-k member (film-shaped) |
|---|---|---|---|---|
| Off-current | 24 | 5.9 nA | 2.9 nA (−51%) | 4.5 nA (−23%) |
| | 48 | 627.6 nA | 517.4 nA (−18%) | 613.0 nA (−2%) |
| On-current | 24 | 13.4 μA | 11.2 μA (+6%) | 13.6 μA (+2%) |
| | 48 | 15.5 μA | 16.4 μA (+6%) | 15.7 μA (+1%) |

As shown in TABLE 2, in the practical example 1, compared with the comparative example, the off-current significantly decreased, and the on-current increased by approximately 6%. Although falling short of the practical example 1, the practical example 2 also exhibited the decrease of off-current and the increase of on-current compared with the comparative example. Thus, the effect of increasing the on-current and decreasing the off-current was achieved by providing a dielectric member 26 between the silicon pillars 21.

The embodiments described above can realize an integrated circuit device having high operational stability.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. An integrated circuit (IC) device comprising:
   an electrode extending in a first direction;
   two semiconductor members spaced from each other in the first direction and extending in a second direction crossing the first direction;
   an insulating film placed between each of the two semiconductor members and the electrode and made of a first insulating material; and
   a first dielectric member placed between the two semiconductor members and made of a second insulating material having a higher permittivity than the first insulating material.

2. The IC device according to claim 1, wherein the first dielectric member is placed in entirety of a space between the two semiconductor members.

3. The IC device according to claim 1, further comprising:
   an insulating member placed between the two semiconductor members and made of a third insulating material having a lower permittivity than the second insulating material,
   wherein the first dielectric member is placed between the insulating member and the insulating film.

4. The IC device according to claim 1, wherein the first dielectric member is not in contact with the two semiconductor members.

5. The IC device according to claim 4, wherein the insulating film is placed so as to surround each of the two semiconductor members in a cross section orthogonal to the second direction.

6. The IC device according to claim 5, wherein the first dielectric member is in contact with the electrode.

7. The IC device according to claim 5, wherein the first dielectric member is not in contact with the electrode.

8. The IC device according to claim 4, wherein part of the insulating film is placed between the semiconductor member and the first dielectric member.

9. The IC device according to claim 1, wherein the semiconductor member is shaped like a rectangle in a cross section orthogonal to the second direction.

10. The IC device according to claim 1, wherein the first insulating material includes silicon oxide.

11. The IC device according to claim 1, wherein the second insulating material includes one or more materials selected from the group consisting of silicon nitride, silicon oxynitride, hafnium oxide, and aluminum oxide.

12. The IC device according to claim 11, wherein the first insulating material is silicon oxide, and the second insulating material is silicon nitride.

13. The IC device according to claim 1, wherein
   the two semiconductor members each include:
   a first portion of a first conductivity type;
   a second portion of a second conductivity type; and
   a third portion of the first conductivity type,
   the first portion, the second portion, and the third portion are arranged in this order along the second direction, and
   a surface of the electrode on the first portion side is located on the first portion side of an interface between the first portion and the second portion, and a surface of the electrode on the third portion side is located on the third portion side of an interface between the second portion and the third portion.

14. The IC device according to claim 1, further comprising:
   two memory elements respectively connected to two end parts of the two semiconductor members on one side of the second direction; and
   a first wiring extending in a third direction and connected to one of the two memory elements, the third direction crossing the first direction and the second direction.

15. The IC device according to claim 14, wherein the memory element is a magnetic tunnel junction element.

16. The IC device according to claim 1, further comprising:
   two first wirings respectively connected to the end parts of the two semiconductor members on one side and extending in the second direction;
   two memory elements connected to the first wirings respectively;
   a second wiring extending in the first direction and connected to the two memory elements; and
   two third wirings respectively connected to end parts of the two semiconductor members on the other side of the second direction.

17. An integrated circuit (IC) device comprising:
   two first wirings extending in a first direction and spaced from each other in a second direction crossing the first direction;
   two semiconductor members spaced from each other in the second direction and extending in a third direction crossing the first direction and the second direction, end parts of the two semiconductor members on one side of the third direction respectively connected to the two first wirings;
   an electrode extending in the second direction;
   an insulating film placed between each of the two semiconductor members and the electrode and made of a first insulating material; and
   a first dielectric member placed between the two semiconductor members and made of a second insulating material having a higher permittivity than the first insulating material;
   two second wirings respectively connected to end parts of the two semiconductor members on the other side of the third direction and extending in the third direction;
   a third wiring; and
   two resistance change films respectively connected between the two second wirings and the third wiring,
   the two second wirings, the two resistance change films, and the third wiring forming two memory elements.

18. The IC device according to claim 17, wherein
   the first dielectric member is not in contact with the two semiconductor members,
   the insulating film is placed so as to surround each of the two semiconductor members in a cross section orthogonal to the third direction.

19. The IC device according to claim 17, wherein the first insulating material includes silicon oxide.

20. The IC device according to claim 17, wherein the second insulating material includes one or more materials selected from the group consisting of silicon nitride, silicon oxynitride, hafnium oxide, and aluminum oxide.

* * * * *